(12) United States Patent
Miyachi et al.

(10) Patent No.: US 8,236,588 B2
(45) Date of Patent: Aug. 7, 2012

(54) METHOD FOR MANUFACTURING A MULTI-WAVELENGTH INTEGRATED SEMICONDUCTOR LASER

(75) Inventors: Mamoru Miyachi, Saitama (JP); Yoshinori Kimura, Saitama (JP)

(73) Assignee: Pioneer Corporation, Tokyo (JP)

( * ) Notice: Subject to any disclaimer, the term of this patent is extended or adjusted under 35 U.S.C. 154(b) by 1067 days.

(21) Appl. No.: 12/158,648

(22) PCT Filed: Dec. 14, 2006

(86) PCT No.: PCT/JP2006/324924
§ 371 (c)(1),
(2), (4) Date: Jun. 20, 2008

(87) PCT Pub. No.: WO2007/072726
PCT Pub. Date: Jun. 28, 2007

(65) Prior Publication Data
US 2009/0311815 A1 Dec. 17, 2009

(30) Foreign Application Priority Data
Dec. 20, 2005 (JP) .................................. 2005-366616

(51) Int. Cl.
*H01S 3/063* (2006.01)
(52) U.S. Cl. .............. 438/31; 438/35; 438/39; 438/455; 438/977; 372/50.121; 372/64
(58) Field of Classification Search .................... 438/31, 438/35, 39, 455, 977; 372/50.121, 64
See application file for complete search history.

(56) References Cited

U.S. PATENT DOCUMENTS
2010/0054292 A1* 3/2010 Bessho ........................ 372/49.01

FOREIGN PATENT DOCUMENTS

| JP | 61-285783 A | 12/1986 |
|----|-------------|---------|
| JP | 10-56230 A | 2/1998 |
| JP | 11-112091 A | 4/1999 |
| JP | 2002-124737 A | 4/2002 |
| JP | 2003-86879 A | 3/2003 |
| JP | 2004-207479 A | 7/2004 |
| JP | 2004-207480 A | 7/2004 |
| JP | 2004-289010 A | 10/2004 |
| JP | 2005-101483 A | 4/2005 |
| JP | 2005-142347 A | 6/2005 |
| JP | 2005-209950 A | 8/2005 |
| JP | 2005-268754 A | 9/2005 |

* cited by examiner

*Primary Examiner* — Zandra Smith
*Assistant Examiner* — Toniae Thomas
(74) *Attorney, Agent, or Firm* — Arent Fox LLP

(57) ABSTRACT

An object is to provide a multi-wavelength integrated semiconductor laser device which can reduce variations in emission point distance, can be formed by simplified manufacturing processes, and can provide improve electric characteristics.

A first semiconductor laser element 100 having an active layer AL1 for emitting a laser beam of a first wavelength from its light-emitting point X1 and a second semiconductor laser element 200 having an active layer AL2 for emitting a laser beam of a second wavelength from its light-emitting point X2 are bonded to each other via an adhesive layer MC made of metal. At least either one of the semiconductor laser elements has a ridge waveguide made of an n-type semiconductor. The semiconductor laser elements 100 and 200 are bonded via the metal adhesive layer MC at the sides of their respective p-type semiconductors. A submount SUB is bonded to the first semiconductor laser element 100 via metal at a side where its ridge waveguide is formed.

16 Claims, 10 Drawing Sheets

METHOD FOR MANUFACTURING A MULTI-WAVELENGTH INTEGRATED SEMICONDUCTOR LASER

TECHNICAL FIELD

The present invention relate to a multi-wavelength integrated semiconductor laser device for emitting a plurality of laser beams having different wavelengths, and a method for manufacturing the same.

BACKGROUND ART

In the technical fields of performing measurements or recording and reproducing information by using laser light, multi-wavelength integrated semiconductor laser devices have been used for emitting a plurality of laser beams of different wavelengths.

For example, in a measuring instrument intended for biometrics, a multi-wavelength integrated semiconductor laser device is used to irradiate biological substances with laser beams of different wavelengths. Fluorescence caused by biological reactions is detected to measure trace substances, immunogenic properties, and the like inside the living body optically.

Information recording and reproducing apparatuses and the like having compatibility with recording media of different recording and reproduction systems, such as DVD (Digital Versatile Disc) and CD (Compact Disc), have a pickup unit on which a multi-wavelength integrated semiconductor laser is mounted. Laser beams having predetermined wavelengths suited to respective recording media are emitted for compatible information recording and reproduction.

Among conventional multi-wavelength integrated semiconductor laser devices to be mounted on the pickup unit is one disclosed in patent document 1.

This conventional multi-wavelength integrated semiconductor laser device has a structure intended for miniaturization. As shown in FIGS. 1(A) and 2 of the document, electrodes 14 are formed at predetermined ends of separate semiconductor light-emitting elements 1 and 3 having different resonator lengths (at the ends closer to respective light-emitting points 2 and 4). Soldering metal 26 interposed therebetween is heat bonded to integrate the semiconductor light-emitting elements 1 and 3 with each other, thereby achieving a multi-wavelength integrated semiconductor laser device as a single member.

This structure provides the effect that the light-emitting points 2 and 4 can be located at a distance (emission point distance) W as close as 100 μm or less (around 72 μm). It is described that recording media of different recording and reproducing systems, such as DVD and CD or CD-R, can thus be irradiated with the laser beams through a single optical path, which allows simplification and miniaturization of the apparatus configuration.

[Patent document 1] Japanese Patent Application Laid-Open No. Hei 11-112091.

DISCLOSURE OF THE INVENTION

Problems to be Solved by the Invention

Now, since the conventional multi-wavelength integrated semiconductor laser device described above has the structure that the two independent chips of the semiconductor light-emitting elements 1 and 3 are integrated by heat bonding through the use of the soldering metal 26, it is difficult to increase the positioning accuracy itself at the time of alignment. A mechanical displacement during the heat bonding can also cause a misalignment with a drop in the relative position accuracy between the two ridge waveguides, producing such problems as variations in the emission point distance.

Besides, since the semiconductor light-emitting elements 1 and 3 have a substrate each, both the two active layers come between the substrates when the elements are joined at the sides of their p-type semiconductors as shown in FIG. 1(A). This precludes satisfactory dissipation of heat from the area of the active layers. When the elements are joined at the sides of the n-type semiconductors as shown in FIG. 4(A), both the substrates come between the two light-emitting points. This makes it impossible to locate the two light-emitting points as close as or closer than several tens of micrometers.

Moreover, as shown in FIGS. 1(A) and 4(A), the semiconductor lasers both have an internal current confinement structure. Since the current-confined ridge stripes are entirely buried in the semiconductors, the heat dissipation becomes even poorer in the area of the active layers. Given a ridge waveguide structure, the p electrodes and the p-type contact layers make contact with each other only at the tops of the ridge waveguides. This makes it difficult to reduce the contact resistances of the p electrodes sufficiently.

The present invention has been achieved in view of the foregoing conventional problems. It is thus an object thereof to provide a multi-wavelength integrated semiconductor laser device which can reduce variations in the emission point distance, can be formed by simplified manufacturing processes, and can provide improved electric characteristics as well as favorable heat dissipation characteristics, and a method for manufacturing the same.

Means for Solving the Problems

The invention according to claim 12 is a method for manufacturing a multi-wavelength integrated semiconductor laser device for emitting laser beams of different wavelengths, the method including: a first step of forming a first semiconductor laser multilayer film on a first substrate, the first semiconductor laser multilayer film including an etching stop layer; a second step of forming a second semiconductor laser multilayer film on a second substrate; a third step of forming a ridge waveguide in the second semiconductor laser multilayer film; a fourth step of bonding the first semiconductor laser multilayer film and the second semiconductor laser multilayer film to each other via an adhesive layer made of metal; a fifth step of etching the first substrate to expose the etching stop layer; a sixth step of etching the etching stop layer; a seventh step of forming a ridge waveguide in the first semiconductor laser multilayer film; and an eighth step of etching the first semiconductor laser multilayer film, except a predetermined area including the ridge waveguide of the first semiconductor laser.

The invention according to claim 19 is a method for manufacturing a multi-wavelength integrated semiconductor laser device for emitting laser beams of different wavelengths, the method including: a first step of forming a first semiconductor laser multilayer film on a first substrate, the first semiconductor laser multilayer film including a first etching stop layer; a second step of forming a second semiconductor laser multilayer film on a second substrate, the second semiconductor laser multilayer film including a second etching stop layer; a third step of bonding the first semiconductor laser multilayer film and the second semiconductor laser multilayer film to each other via an adhesive layer made of metal; a fourth step of etching the first substrate to expose the first etching stop layer; a fifth step of etching the first etching stop layer; a sixth step of forming a ridge waveguide in the first semiconductor laser multilayer film; a seventh step of bonding a submount to the first semiconductor laser multilayer film via metal at a side where the ridge waveguide is formed; an eighth step of etching the second substrate to expose the second etching stop layer; a ninth step of etching the second etching stop layer; a tenth step of forming a ridge waveguide in the second semiconductor laser multilayer film; and an eleventh step of etching the second semiconductor laser multilayer film, except a predetermined area including the ridge waveguide of the second semiconductor laser.

BEST MODE FOR CARRYING OUT THE INVENTION

The best mode for carrying out the invention will be described with reference to the drawings.

Figure 1:
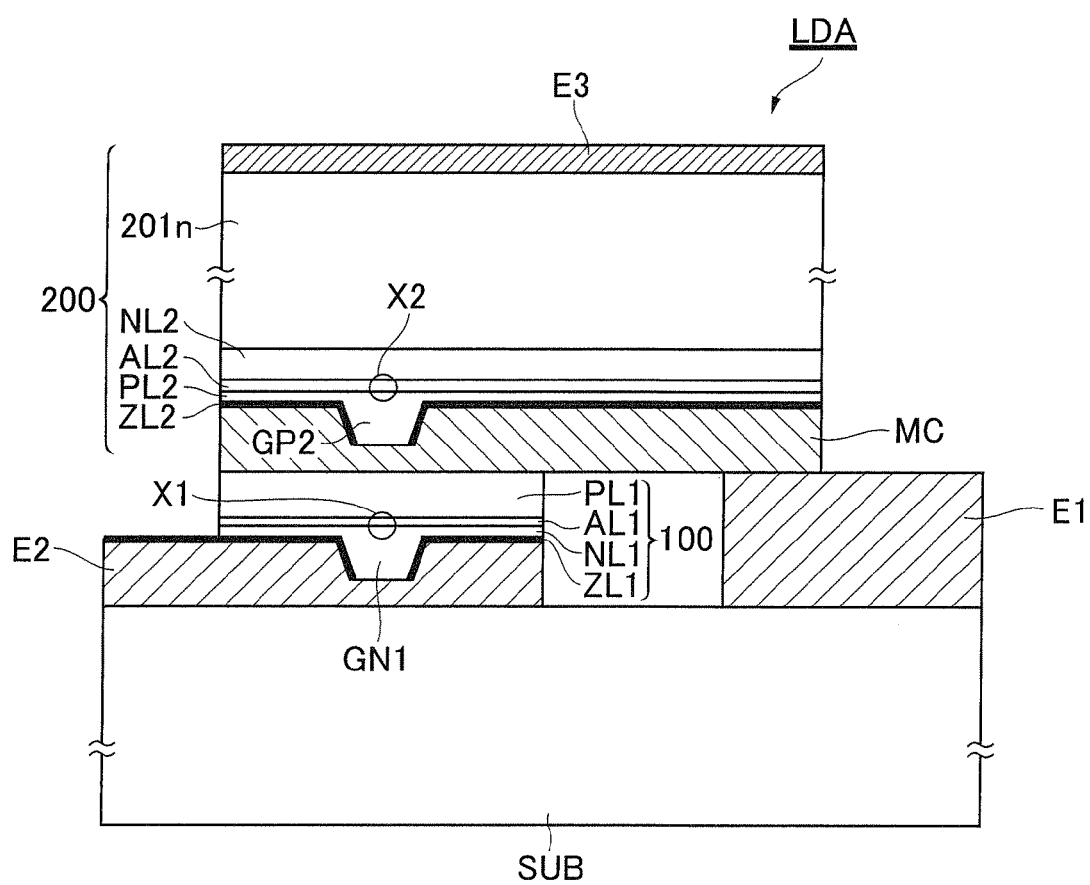
FIG. 1 is a sectional view showing the structure of a multi-wavelength integrated semiconductor laser device according to a first embodiment and example 1.
Figure 2:
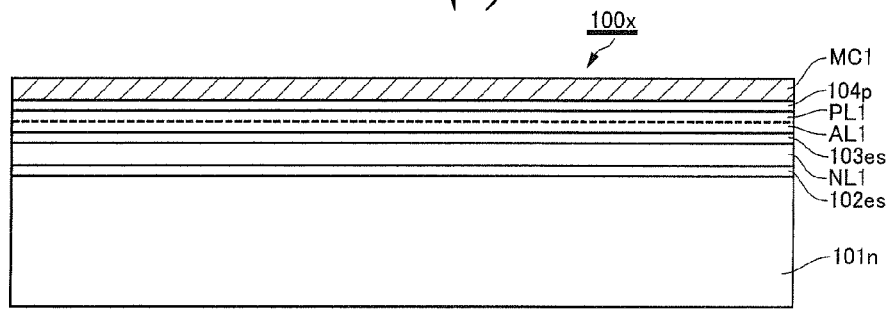
FIG. 2 is a diagram for explaining processes for manufacturing the multi-wavelength integrated semiconductor laser device according to the first embodiment and example 1.
Figure 2:
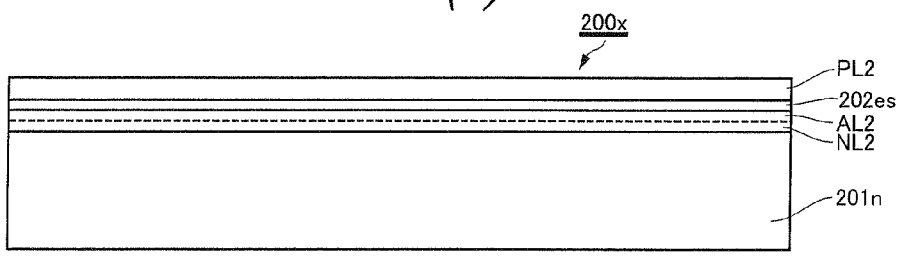
Figure 2:
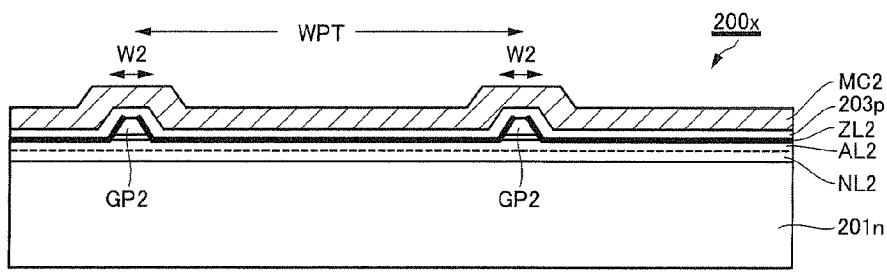
Figure 2:
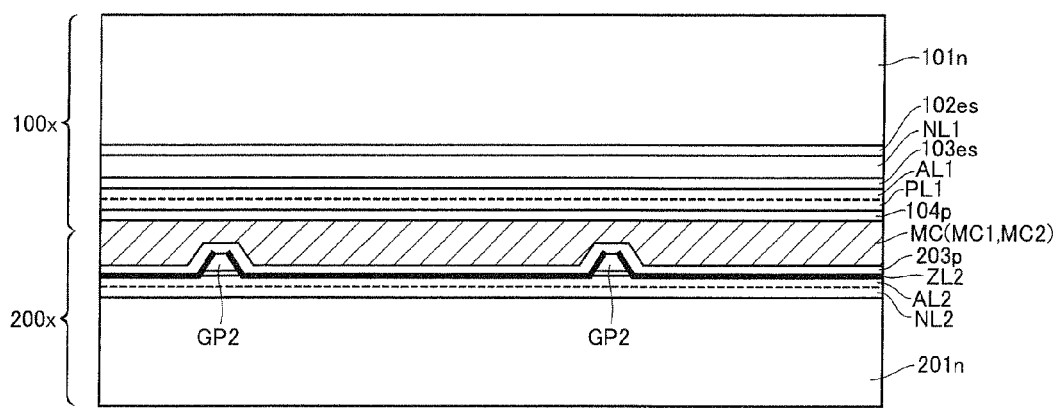
Figure 3:
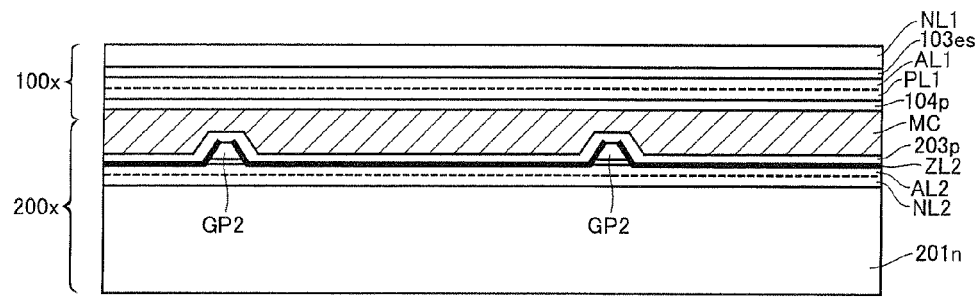
FIG. 3 is a diagram for explaining the processes for manufacturing the multi-wavelength integrated semiconductor laser device according to the first embodiment and example 1 further.
Figure 3:
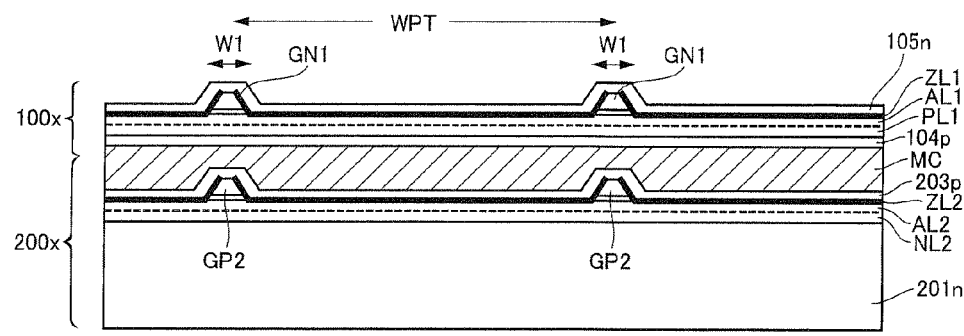
Figure 3:
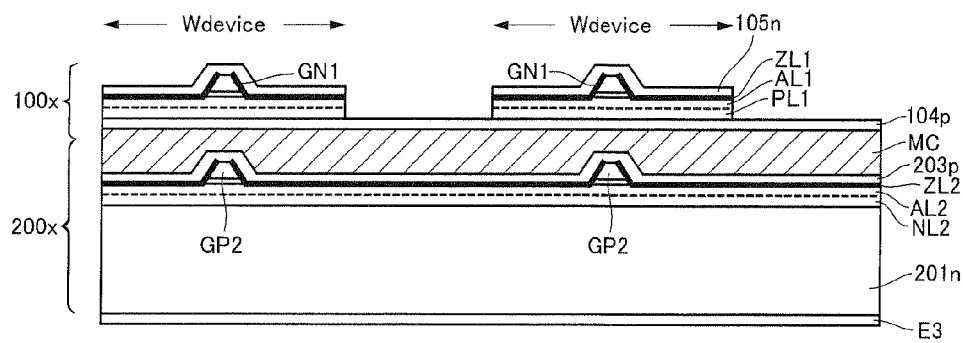
Figure 4:
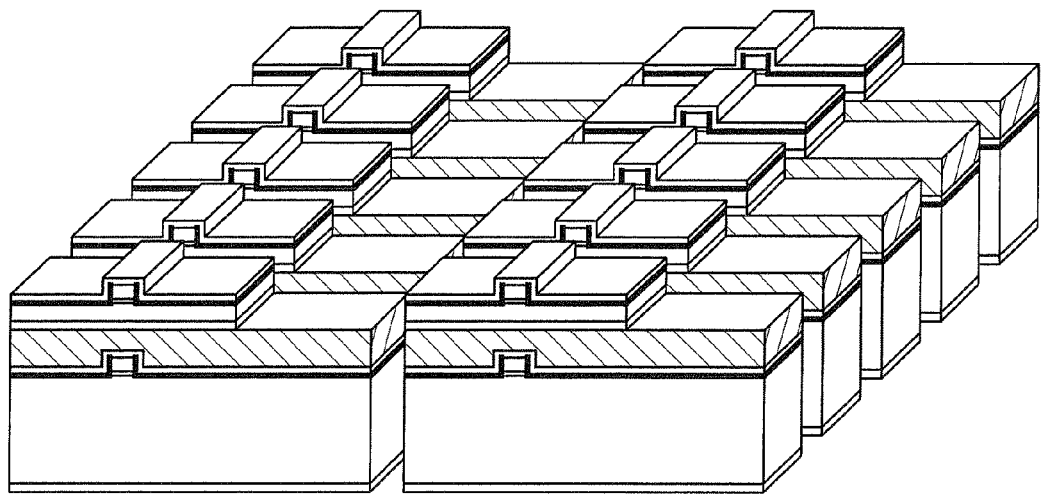
FIG. 4 is a diagram for explaining the processes for manufacturing the multi-wavelength integrated semiconductor laser device according to the first embodiment and example 1 further.
Figure 4:
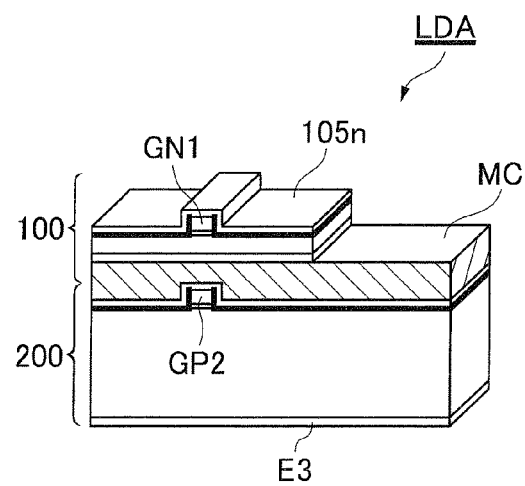

FIG. 1 is a sectional view showing the basic structure of a multi-wavelength integrated semiconductor laser device according to a first embodiment. FIGS. 2 to 4 are manufacturing process diagrams for explaining a method for manufacturing the multi-wavelength integrated semiconductor laser device according to the first embodiment.

Figure 5:
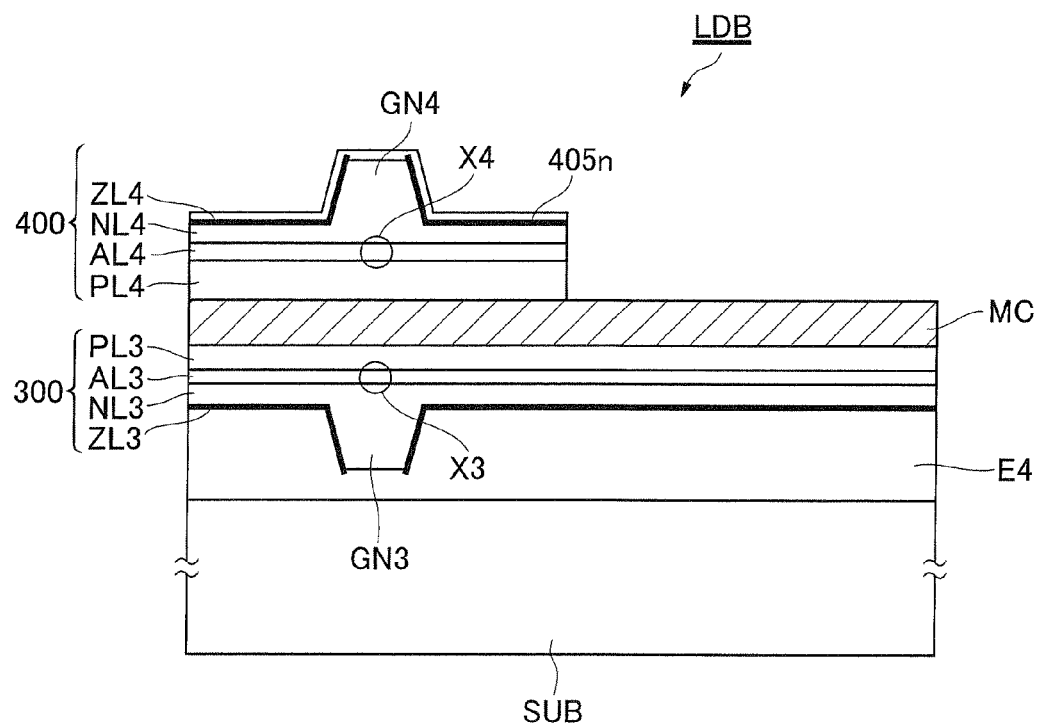
FIG. 5 is a sectional view showing the structure of a multi-wavelength integrated semiconductor laser device according to a second embodiment and example 2.
Figure 6:
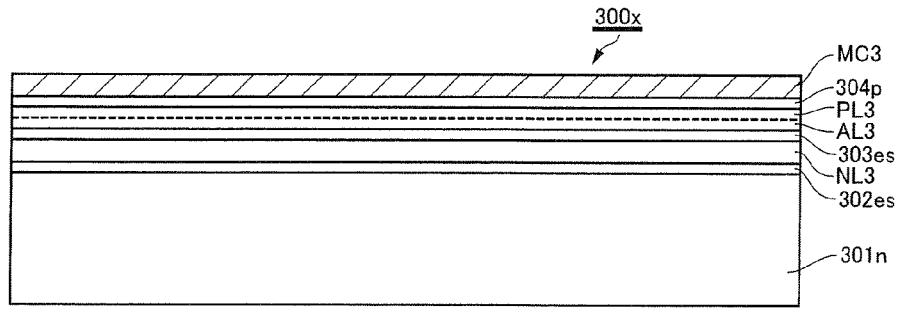
FIG. 6 is a diagram for explaining processes for manufacturing the multi-wavelength integrated semiconductor laser device according to the second embodiment and example 2.
Figure 6:
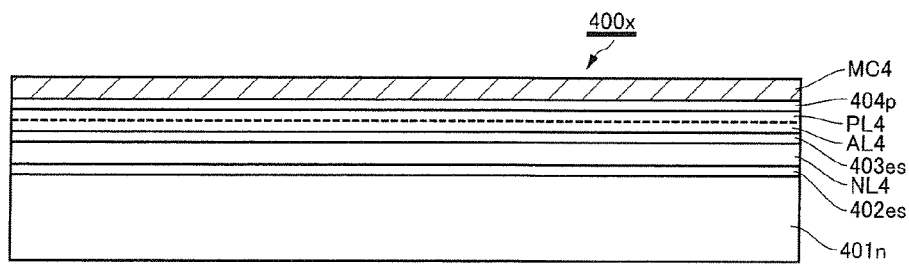
Figure 6:
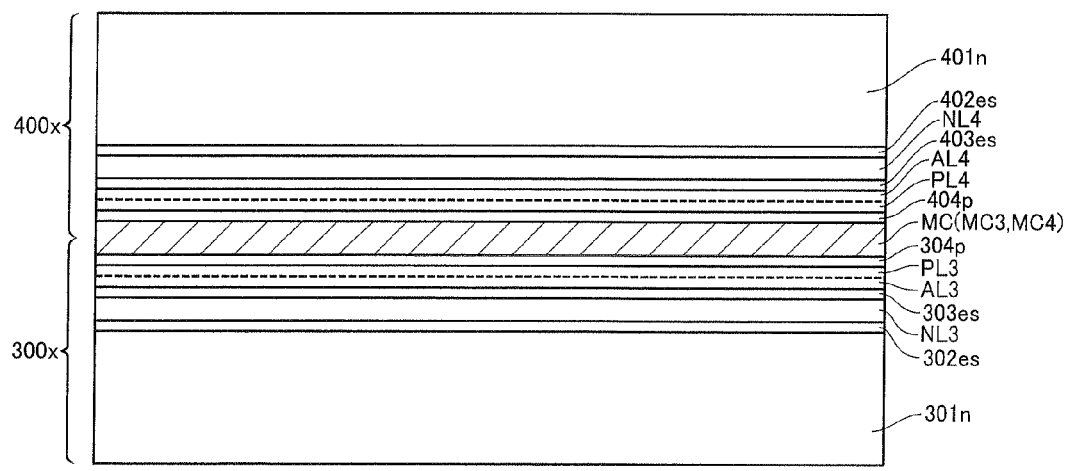
Figure 7:
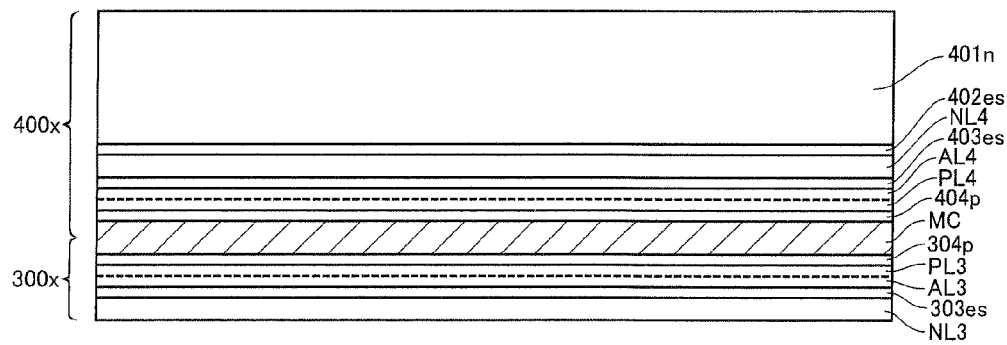
FIG. 7 is a diagram for explaining the processes for manufacturing the multi-wavelength integrated semiconductor laser device according to the second embodiment and example 2 further.
Figure 7:
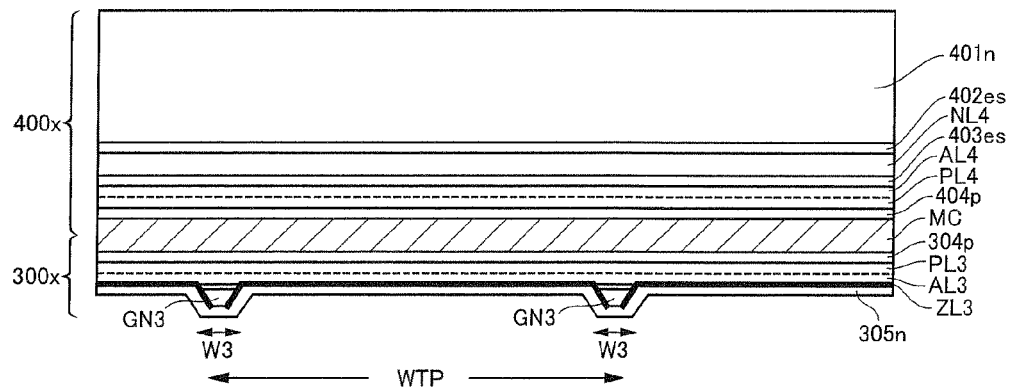
Figure 7:
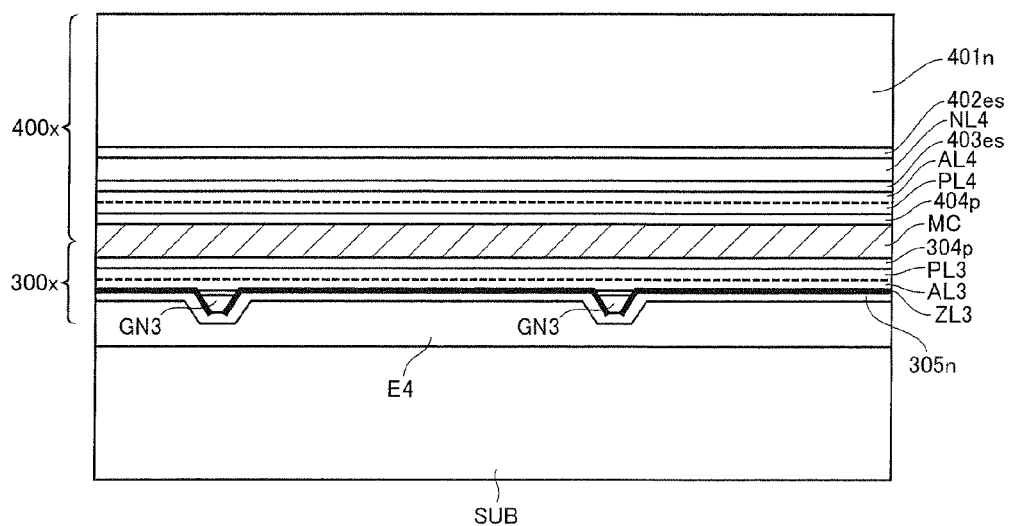
Figure 8:
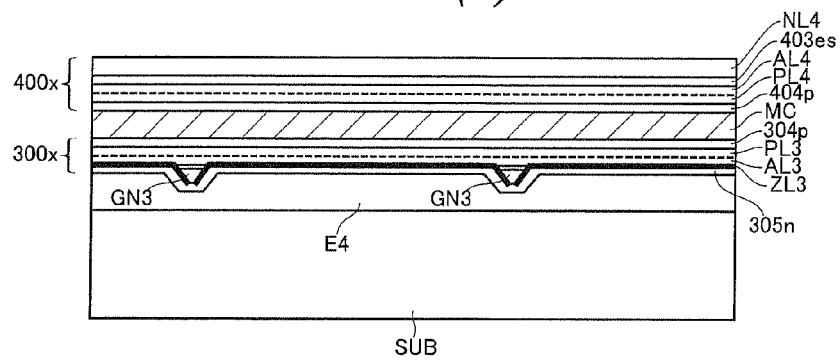
FIG. 8 is a diagram for explaining the processes for manufacturing the multi-wavelength integrated semiconductor laser device according to the second embodiment and example 2 further.
Figure 8:
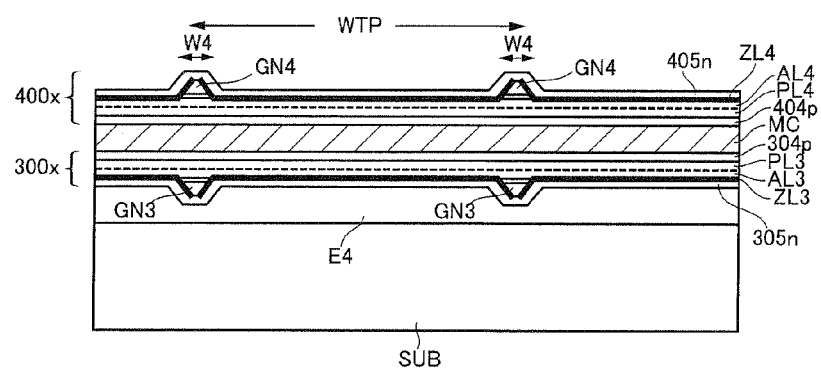
Figure 8:
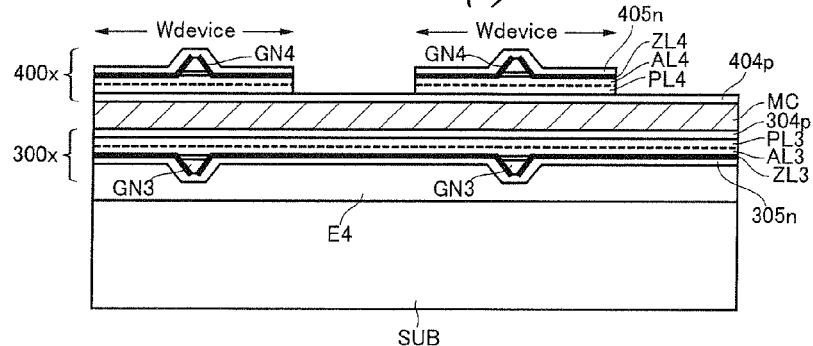
Figure 8:
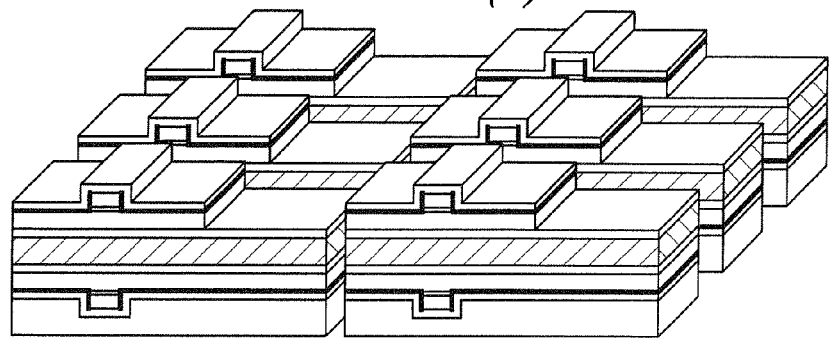

FIG. 5 is a sectional view showing the basic structure of a multi-wavelength integrated semiconductor laser device according to a second embodiment. FIGS. 6 to 8 are manufacturing process diagrams for explaining a method for manufacturing the multi-wavelength integrated semiconductor laser device according to the second embodiment.

First Embodiment

With reference to FIG. 1, a description will be given of the structure of a multi-wavelength integrated semiconductor laser device according to the first embodiment.

This multi-wavelength integrated semiconductor laser device LDA has the structure that two semiconductor laser elements 100 and 200 are integrally laminated by means of an adhesive layer MC made of metal, and is bonded to a submount SUB via two electrically-isolated electrodes E1 and E2.

More specifically, though the structure will be detailed later in conjunction with the manufacturing method, the first semiconductor laser element 100 includes a p-type layer PL1 including a p-type contact layer and a p-type clad layer, an active layer AL1, and an n-type layer NL1 including an n-type clad layer and an n-type contact layer. The n-type layer is provided with a ridge waveguide (hereinafter, referred to as "n-type ridge waveguide") GN1.

The second semiconductor laser element 200 includes an n-type substrate 201$n$, an n-type layer NL2 including an n-type clad layer, an active layer AL2, and a p-type layer PL2 including a p-type clad layer and a p-type contact layer. The p-type layer is provided with a ridge waveguide (hereinafter, referred to as "p-type ridge waveguide") GP2.

The p-type layer PL2 and the p-type layer PL1 are bonded to each other via the metal adhesive layer MC. The n-type ridge waveguide GN1 of the first semiconductor laser element 100 and the p-type ridge waveguide GP2 of the second semiconductor laser element 200 are arranged in parallel at a predetermined distance.

Here, the surface of the n-type layer NL1 is covered with an insulating film ZL1, excluding the top of the n-type ridge waveguide GN1 of the first semiconductor laser element 100. An n-side electrode is formed over the top of the n-type ridge waveguide GN1 and the insulating film ZL1. The surface of the p-type layer PL2 is covered with an insulating film ZL2, excluding the top of the p-type ridge waveguide GP2 of the second semiconductor laser element 200. A p-side electrode is formed over the top of the p-type ridge waveguide GN2 and the insulating film ZL2. In addition, an n-side electrode E3 for applying a drive voltage is formed on the backside of the n-type substrate 201$n$ of the second semiconductor laser element 200.

The electrode E1 on the submount SUB and one end of the adhesive layer MC are bonded to each other, and the electrode E2 on the submount SUB and the surface of the first semiconductor laser element 100 at the side of the n-type ridge waveguide GN1 are bonded to each other. This makes the shown configuration available for use.

In the multi-wavelength integrated semiconductor laser device LDA having this structure, a predetermined drive voltage V1 is applied to between the electrodes E1 and E2 of the submount SUB. A drive current flows into the first semiconductor laser element 100, and a laser beam having a predetermined wavelength is emitted from a light-emitting point X1 of the active layer AL1.

When a predetermined drive voltage V2 is applied to between the electrode E1 of the submount SUB and the n-side electrode E3 of the second semiconductor laser element 200, a drive current flows into the second semiconductor laser element 200. A laser beam having a predetermined wavelength different from that of the first semiconductor laser element 100 is emitted from a light-emitting point X2 of the active layer AL2.

When the predetermined drive voltages V1 and V2 are simultaneously applied to between the electrodes E1 and E2 and between the electrode E1 and the n-side electrode E3 of the second semiconductor laser element 200, respectively, the drive currents flow into the first semiconductor laser element 100 and the second semiconductor laser element 200 as well. The laser beams having the different wavelengths are thus emitted from the respective light-emitting points X1 and X2 at the same time.

In this way, the multi-wavelength integrated semiconductor laser device LDA can emit the two laser beams of different wavelengths independently or simultaneously.

Next, a method for manufacturing the multi-wavelength integrated semiconductor laser device LDA will be described with reference to FIGS. 2 to 4.

Initially, a first intermediate product 100x for fabricating the first semiconductor laser element 100 and a second intermediate product 200x for fabricating the second semiconductor laser element 200 are formed by the manufacturing steps shown in FIGS. 2(a) to 2(c). Here, the intermediate products 100x and 200x are formed in a wafer form.

More specifically, to form the first intermediate product 100x, as shown in the sectional view of FIG. 2(a), a first etching stop layer 102es, the n-type layer NL1 including the n-type contact layer and the n-type clad layer, a second etching stop layer 103es, the active layer AL1, and the p-type layer PL1 including the p-type clad layer and the p-type contact layer are deposited on an n-type substrate 101n in this order, thereby forming a semiconductor laser multilayer film. A p-side electrode 104p and a metal adhesive layer MC1 are formed on the p-type contact layer of the p-type layer PL1 further, thereby forming the first intermediate product 100x.

Next, to form the second intermediate product 200x, as shown in the sectional view of FIG. 2(b), the n-type layer NL2 including the n-type clad layer, the active layer AL2, an etching stop layer 202es, and the p-type layer PL2 including the p-type clad layer and the p-type contact layer are deposited on the n-type substrate 201n in this order, thereby forming a semiconductor laser multilayer film. As shown in the sectional view of FIG. 2(c), the p-type contact layer and the p-type clad layer of the p-type layer PL2 are partly etched down to the etching stop layer 202es, thereby forming p-type ridge waveguides GP2. Here, a plurality of p-type ridge waveguides GP2 are formed in advance at a predetermined pitch interval WPT and in a predetermined width W2. The insulating film ZL2 is formed over the entire surface of the p-type layer PL2 except the tops of the p-type ridge waveguides GP2. Then, a p-side electrode 203p and a metal adhesive layer MC2 are formed over the entire surface including the tops of the p-type ridge waveguides GP2 and the insulating film ZL2, thereby completing the second intermediate product 200x.

Next, as shown in the sectional view of FIG. 2(d), the adhesive layer MC2 of the second intermediate product 200x and the adhesive layer MC1 of the first intermediate product 100x are bonded into an integrated adhesive layer MC. This laminates the first and second intermediate products 100x and 200x integrally.

Next, as shown in the sectional view of FIG. 3(a), the n-type substrate 101n of the first intermediate product 100x is etched off to expose the first etching stop layer 102es. Next, the first etching stop layer 102es is also etched off to expose the n-type contact layer of the n-type layer NL1.

Next, as shown in the sectional view of FIG. 3(b), the n-type contact layer and the n-type clad layer of the n-type layer NL1 are partly etched down to the second etching stop layer 103es, thereby forming n-type ridge waveguides GN1. Here, a plurality of n-type ridge waveguides GN1 are formed at a pitch interval corresponding to the pitch interval WPT of the p-type ridge waveguides GP2 which are formed on the second intermediate product 200x in advance, so that they are opposed to the p-type ridge waveguides GP2 across a uniform distance. After the insulating film ZL1 is formed over the n-type layer NL1 except the tops of the n-type ridge waveguides GN1, an n-side electrode 105n is formed over the tops of the n-type ridge waveguides GN1 and the insulating film ZL1.

Next, as shown in the sectional view of FIG. 3(c), the n-side electrode 105n, the insulating film ZL1, and the semiconductor laser multilayer film of the first intermediate product 100x are partly etched to expose the adhesive layer MC in part, excluding areas Wdevice for forming the first and second semiconductor laser elements 100 and 200. The n-side electrode E3 is also formed on the backside of the n-type substrate 201n of the second intermediate product 200x.

Next, as shown in the perspective view of FIG. 4(a), primary cleaving and secondary cleaving are performed for separation. This produces each individual multi-wavelength integrated semiconductor laser device LDA such as shown in FIG. 4(b) in which the first semiconductor element 100 and the second semiconductor laser element 200 are integrated with each other.

For example, as shown in FIG. 1, the adhesive layer MC and the n-side electrode 105n of the first semiconductor laser element 100 are then bonded to the electrodes E1 and E2 of the submount SUB, respectively.

As has been described, according to the multi-wavelength integrated semiconductor laser device LDA of the present embodiment, the ridge waveguide GN1 of the first semiconductor laser element 100 is formed on the n-type semiconductor side as shown in FIG. 1. This structure can reduce the contact resistance of the p-side electrode 104p since the entire surface of the p-type layer PL1 is in contact with this p-side electrode over a large contact area.

According to the multi-wavelength integrated semiconductor laser device LDA of the present embodiment, the first semiconductor laser element 100 has no substrate. The first semiconductor laser element 100 is thus extremely small in total thickness, so that the active layer AL1 of the first semiconductor laser element 100 and the active layer AL2 of the second semiconductor laser element 200 both can be located close to the submount. This makes it possible to dissipate heat occurring both in the first semiconductor laser element 100 and the second semiconductor laser element 200 through the submount SUB efficiently.

According to the manufacturing method of the present embodiment, the first intermediate product 100x and the second intermediate product 200x for fabricating the first semiconductor laser element 100 and the second semiconductor laser element 200 are laminated in a wafer state before they are cleaved into each individual multi-wavelength integrated semiconductor laser device LDA. This can simplify the manufacturing processes and allow uniform formation of multi-wavelength integrated semiconductor laser devices LDA for high mass productivity. Moreover, according to the manufacturing method, the first intermediate product 100x and the second intermediate product 200x are bonded by the adhesive layer MC before the resonator ends and sidewalls of the respective semiconductor laser elements are formed. This can avoid problems such as an electric short circuit ascribable to intrusion of the adhesive layer into those portions, and can thus achieve a multi-wavelength semiconductor laser element LOB of high reliability.

As shown in FIG. 3(b), the n-type ridge stripe GN1 of the first semiconductor laser element 100 is formed to the position of the ridge waveguide GP2 of the second intermediate product 200x after the first intermediate product 100x and the second intermediate product 200x are laminated with each other. The relative positions of the two ridge waveguides can thus be matched with high accuracy. More specifically, if the waveguides are formed on both the semiconductor lasers before the lamination of the two semiconductor lasers as in the conventional techniques, the two waveguides must be positioned to each other at the time of the lamination. This lowers the accuracy of the relative position between the two waveguides because of stress occurring from laminating heat and the like. The present embodiment, on the contrary, is free from the possibility of this stress-based misalignment between the two waveguides.

As a result, each individual multi-wavelength integrated semiconductor laser device LDA can be manufactured with the light-emitting point X1 of the first semiconductor laser element 100 and the light-emitting point X2 of the second semiconductor laser element 200 at a uniform emission point distance with high accuracy. Incidentally, the positioning accuracy available here is of submicron order.

Second Embodiment

Next, a multi-wavelength integrated semiconductor laser device according to a second embodiment will be described with reference to FIGS. 5 to 8.

As shown in the sectional view of FIG. 5, the multi-wavelength integrated semiconductor laser device LDB according to the present embodiment has the structure that two semiconductor laser elements 300 and 400 are integrally laminated by means of an adhesive layer MC made of metal, and is bonded to a submount SUB via an electrode E4.

More specifically, though the structure will be detailed in conjunction with the manufacturing method, the first semiconductor laser element 300 includes a p-type layer PL3 including a p-type contact layer and a p-type clad layer, an active layer AL3, and an n-type layer NL3 including an n-type clad layer and an n-type contact layer. The n-type layer is provided with a ridge waveguide (hereinafter, referred to as "n-type ridge waveguide") GN3.

The second semiconductor laser element 400 includes a p-type layer PL4 including a p-type contact layer and a p-type clad layer, an active layer AL4, and an n-type layer NL4 including an n-type clad layer and an n-type contact layer. The n-type layer is provided with a ridge waveguide (hereinafter, referred to as "n-type ridge waveguide") GN4.

The p-type layers PL3 and PL4 are bonded to each other via the metal adhesive layer MC. The n-type ridge waveguide GN3 of the first semiconductor laser element 300 and the n-type ridge waveguide GN4 of the second semiconductor laser element 400 are arranged in parallel at a predetermined distance.

Here, the surface of the n-type layer NL3 is covered with an insulating film ZL3, excluding the top of the n-type ridge waveguide GN3 of the first semiconductor laser element 300. An n-side electrode (not shown) is formed over the top of the n-type ridge waveguide GN3 and the insulating film ZL3. The first semiconductor laser element 300 and the electrode E4 of the submount SUB are bonded to each other via this n-side electrode. The surface of the n-type layer NL4 is covered with an insulating film ZL4, excluding the top of the n-type ridge waveguide GN4 of the second semiconductor laser element 400. A p-side electrode 405n is formed over the top of the n-type ridge waveguide GN4 and the insulating film ZL4. A predetermined drive voltage V2 for driving the second semiconductor laser element 400 is applied through this p-side electrode 405n.

In the multi-wavelength integrated semiconductor laser device LDB having this structure, a predetermined drive voltage V1 is applied to between the adhesive layer MC and the electrode E4 of the submount SUB. A drive current flows into the first semiconductor laser element 300, and a laser beam having a predetermined wavelength is emitted from a light-emitting point X3 of the active layer AL3.

When the predetermined drive voltage V2 is applied to between the adhesive layer MC and the n-side electrode 405n of the second semiconductor laser element 400, a drive current flows into the second semiconductor laser element 400. A laser beam having a predetermined wavelength different from that of the first semiconductor laser element 300 is emitted from a light-emitting point X4 of the active layer AL4.

When the predetermined drive voltages V1 and V2 are simultaneously applied to between the adhesive layer MC and the electrode E4 and between the adhesive layer MC and the n-side electrode 405n, respectively, the drive currents flow into the first semiconductor laser element 200 and the second semiconductor laser element 400 as well. The light beams having the predetermined different wavelengths are thus emitted from the light-emitting points X3 and X4 of the respective active layers AL3 and AL4 at the same time.

Next, a method for manufacturing the multi-wavelength integrated semiconductor laser device LDB will be described with reference to FIGS. 6 to 8.

Initially, a first intermediate product 300x for fabricating the first semiconductor laser element 300 and a second intermediate product 400x for fabricating the second semiconductor laser element 400 are formed by the manufacturing steps shown in FIGS. 6(a) and 6(b). Here, the intermediate products 300x and 400x are formed in a wafer form.

More specifically, to form the first intermediate product 300x, as shown in the sectional view of FIG. 6(a), a first etching stop layer 302es, the n-type layer NL3 including the n-type contact layer and the n-type clad layer, a second etching stop layer 303es, the active layer AL3, and the p-type layer PL3 including the p-type clad layer and the p-type contact layer are deposited on an n-type substrate 301n in this order, thereby forming a semiconductor laser multilayer film. A p-side electrode 304p and a metal adhesive layer MC3 are formed on the p-type contact layer of the p-type layer PL3 further, thereby forming the first intermediate product 300x.

Next, to form the second intermediate product 400x, as shown in the sectional view of FIG. 6(b), a third etching stop layer 402es, the n-type layer NL4 including the n-type contact layer and the n-type clad layer, a second etching stop layer 403es, the active layer AL4, and the p-type layer 214 including the p-type clad layer and the p-type contact layer are deposited on an n-type substrate 401n in this order, thereby forming a semiconductor laser multilayer film. A p-side electrode 404p and a metal adhesive layer MC4 are formed on the p-type contact layer of the p-type layer PL4 further, thereby forming the second intermediate product 400x.

Next, as shown in the sectional view of FIG. 6(c), the adhesive layer MC3 of the first intermediate product 300x and the adhesive layer MC4 of the second intermediate product 400x are bonded into an integrated adhesive layer MC. This laminates the first and second intermediate products 300x and 400x integrally.

Next, as shown in the sectional view of FIG. 7(a), the n-type substrate 301n of the first intermediate product 300x is etched off to expose the first etching stop layer 302es. Next, the first etching stop layer 302es is also etched off to expose the n-type contact layer of the n-type layer NL3.

Next, as shown in FIG. 7(b), the n-type contact layer and the n-type clad layer of the exposed n-type layer NL3 are partly etched down to the second etching stop layer 303es, thereby forming n-type ridge waveguides GN3. Here, a plurality of n-type ridge waveguides GN3 are formed at a predetermined pitch interval WPT and in a predetermined width W3.

After the insulating film ZL3 is formed over the entire surface of the n-type layer NL3 except the tops of these n-type ridge waveguides GN3, an n-side electrode 305n is formed over the tops of the n-type ridge waveguides GN3 and the insulating film ZL3.

Next, as shown in the sectional view of FIG. 7(c), the submount SUB is bonded to the n-side electrode 305n via the metal adhesive layer E4.

Here, the submount SUB is desirably made of a cleavable material. The cleavage plane of this submount SUB and the cleavage planes of the first and second semiconductor laser elements 300 and 400 made of the semiconductor laser multilayer films are aligned with each other for bonding.

If the submount SUB is made of an uncleavable material, however, isolating trenches intended for primary cleaving and secondary cleaving to be described later are formed in the submount SUB in advance. The isolating trenches for primary cleaving and the cleavage planes of the first and second semiconductor laser elements 300 and 400 made of the semiconductor laser multilayer films are aligned with each other for bonding.

Next, as shown in the sectional view of FIG. 8(a), the n-type substrate 401n of the second intermediate product 400x is etched off to expose the third etching stop layer 402es. Next, the first etching stop layer 402es is also etched off to expose the n-type contact layer of the n-type layer NL4.

Next, as shown in the sectional view of FIG. 8(b), the n-type contact layer and the n-type clad layer of the n-type layer NL4 are partly etched down to the fourth etching stop layer 403es, thereby forming n-type ridge waveguides GN4. Here, a plurality of n-type ridge waveguides GN4 are formed at a pitch interval corresponding to the pitch interval WTP of the n-type ridge waveguides GN3 which are formed in advance, so that they are opposed to the n-type ridge waveguides GN3 across a uniform distance. After the insulating film ZL4 is formed over the n-type layer except the tops of the n-type ridge waveguides GN4, the n-side electrode 405n is formed over the tops of the n-type ridge waveguides GN4 and the insulating film ZL4.

Next, as shown in the sectional view of FIG. 8(c), the n-side electrode 405n, the insulating film ZL4, and the semiconductor laser multilayer film of the second intermediate product 400x are partly etched to expose the p-side electrode 404p, excluding the areas Wdevice for forming the first and second semiconductor laser elements 300 and 400.

Next, as shown in the perspective view of FIG. 8(d), the semiconductor laser multilayer films of the first and second intermediate products 300x and 400x are cleaved along with the submount SUB. This produces each individual multi-wavelength semiconductor laser device LDB shown in FIG. 1, having the structure that the first semiconductor laser element 300 and the second semiconductor laser element 400 are integrally laminated by means of the adhesive layer MC.

The multi-wavelength semiconductor laser device LDB according to the present embodiment described above provides the same effects as those of the first embodiment. Besides, according to the multi-wavelength semiconductor laser LDB of the present embodiment, the ridge waveguide GN4 of the second semiconductor laser element 400 is also formed on the n-type semiconductor side as shown in FIG. 5. This structure can reduce the contact resistance of the p-side electrode 404p since the entire surface of the p-side layer PL4 is in contact with this p-side electrode over a large contact area.

The manufacturing method according to the present embodiment can also provide the same effects as those of the foregoing first embodiment. According to the manufacturing method of the present embodiment, as shown in FIG. 6(c), the first intermediate product 300x and the second intermediate product 400x are laminated at their respective flat surfaces where no ridge waveguide lies. This makes it possible to bond the metal adhesive layers MC3 and MC4 by solid-phase diffusion or other processes, not by thermal fusion, so that a heat treatment of relatively high temperatures can be performed after the bonding. More specifically, the bonding can be followed by such heat treatments as electrode alloying and electrode annealing, making it possible to fabricate a multi-wavelength semiconductor laser with excellent electric characteristics.

Furthermore, as shown in FIG. 6(c), the first intermediate product 300x and the second intermediate product 400x are laminated at their respective flat surfaces where no ridge waveguide lies. This makes it possible to bond the adhesive layers MC3 and MC4 by solid-phase diffusion or other processes using such adhesive layers as gold (Au) and aluminum (Al), not by thermal fusion, allowing simplification and the like of the manufacturing processes.

Example 1

Next, a description will be given of multi-wavelength semiconductor laser devices according to more concrete examples.

The multi-wavelength semiconductor laser device according to this example basically has the structure shown in FIG. 1, the integral structure in which a first semiconductor laser element 100 for emitting red laser light of 650 nm in wavelength and a second semiconductor laser element 200 for emitting infrared laser light of 780 nm in wavelength are laminated with a metal adhesive layer MC therebetween. The laser device is basically manufactured through the same manufacturing processes as those of the first embodiment which has been described with reference to FIGS. 2 to 4.

The manufacturing method and the structure of the multi-wavelength semiconductor laser device according to this example will now be described with reference to FIGS. 2 to 4. The description of the manufacturing method and the structure will also use the reference numerals seen in FIGS. 1 to 4.

To fabricate the multi-wavelength semiconductor laser device LDA according to this example, a first intermediate product 100x for fabricating the first semiconductor laser element 100 and a second intermediate product 200x for fabricating the second semiconductor laser element 200 are initially formed by the manufacturing steps shown in FIGS. 2(a) to 2(c).

More specifically, to form the first intermediate product 100x, as shown in FIG. 2(a), a buffer layer (reference numeral omitted) made of n-type GaAs, having a thickness of approximately 0.5 μm is formed on an n-type semiconductor substrate 101n made of n-type GaAs(100). A first etching stop layer 102es of n-type GaInP is then formed to a thickness of approximately 0.05 μm. An n-type contact layer of n-type GaAs, having a thickness of approximately 0.2 µm, and an n-type clad layer of n-type AlGaInP, having a thickness of approximately 1.2 µm, are also deposited in succession to form an n-type layer NL1. Next, a second etching stop layer 103es of n-type GaInP, having a thickness of approximately 0.01 µm, and a multiquantum well structure active layer AL1 of GaInP and AlGaInP, having a thickness of approximately 0.04 µm, are deposited in order. A p-type clad layer of p-type AlGaInP having a thickness of approximately 1.2 µm, an energizing layer of p-type GaInP having a thickness of approximately 0.05 µm, and a p-type contact layer of p-type GaAs having a thickness of approximately 0.2 µm are also deposited in this order to form a p-type layer PL1.

After the semiconductor laser multilayer film is thus formed on the n-type semiconductor substrate 101n, a p-side ohmic electrode layer of Au—Zn and a metal antidiffusion layer of Ti, Pt, Ir, TiN, or the like are deposited on the p-type contact layer of the foregoing p-type layer PL1, thereby forming a p-side electrode 104p. An Sn adhesive layer MC1 is also formed thereon to form the first intermediate product 100x.

To form the second intermediate product 200x, as shown in FIG. 2(b), a buffer layer (reference numeral omitted) made of n-type GaAs, having a thickness of approximately 0.5 µm is formed on an n-type semiconductor substrate 201n made of n-type GaAs(100). An n-type layer NL2 including a clad layer of n-type AlGaAs having a thickness of approximately 1.5 µm, a multiquantum well structure active layer AL2 of AlGaAs having a thickness of approximately 0.03 µm, and an etching stop layer 202es of p-type GaInP having a thickness of approximately 0.012 µm are then deposited in succession. Subsequently, a p-type clad layer of p-type AlGaAs having a thickness of approximately 1.2 µm and a p-type contact layer of p-type GaAs having a thickness of approximately 0.2 µm are deposited to form a p-type layer PL2. In this way, the intermediate product 200x is initially formed in which the semiconductor laser multilayer film is formed on the n-type semiconductor substrate 201n.

Next, as shown in FIG. 2(c), the foregoing p-type layer PL2 (i.e., the p-type contact layer and the p-type clad layer) is partly etched to form p-type ridge waveguides GP2 in <0-11> direction. Here, the n-type ridge waveguides GP2 are formed at a predetermined pitch interval WTP and in a predetermined width W2. An insulating film ZL2 of SiO$_2$ is formed over the entire surface of the p-type layer PL2, excluding the tops of the p-type ridge waveguides GP2. A p-side ohmic electrode layer of Au—Zn and a metal antidiffusion layer of Ti, Pt, Ir, TiN, or the like are then formed over the tops of the p-type ridge waveguides GP2 and the insulating film ZL2, thereby forming a p-side electrode 203p. An Au adhesive layer MC2 is also formed thereon.

Through the foregoing manufacturing steps shown in FIGS. 2(b) and 2(c), the second intermediate product 200x is completed.

Next, as shown in FIG. 2(d), the adhesive layer MC2 of the second intermediate product 200x and the adhesive layer MC1 of the first intermediate product 100x are put into contact with each other and subjected to a pressure of around 1 MP for pressure welding, followed by heating at approximately 300° C. for five minutes. This integrates the adhesive layers MC1 and MC2 into an adhesive layer MC, thereby laminating the first and second intermediate products 100x and 200x integrally. Here, the adhesive layers MC1 and MC2 are bonded so that the crystal orientation <0-11> of the semiconductor multilayer film of the first intermediate product 100x and the semiconductor crystal orientation <0-11> of the second intermediate product 200x coincide with each other.

Next, as shown in FIG. 3(a), the n-type semiconductor substrate 101n and the foregoing buffer layer of the first intermediate product 100x are etched with an etchant that contains ammonia water:hydrogen peroxide water:water in the ratio of 2:1:20, thereby exposing the first etching stop layer 102es. Subsequently, the first etching stop layer 102es exposed is etched with hydrochloric acid to expose the n-type contact layer of the n-type layer NL1. Here, in order not to etch the n-type semiconductor substrate 201n of the intermediate product 200x, the second intermediate product 200x is covered with wax or the like at the side of the n-type semiconductor substrate 201n.

Next, as shown in FIG. 3(b), the n-type layer NL1 (i.e., the n-type contact layer and the n-type clad layer) of the first intermediate product 100x is partly etched down to the second etching stop layer 103es, thereby forming n-type ridge waveguides GN1. Here, the n-type ridge waveguides GN1 are formed to the positions of the p-type ridge waveguides GP2 which are formed on the second intermediate product 200x in advance.

After an insulating film ZL1 of SiO$_2$ is formed over the n-type layer NL1 except the tops of the n-type ridge waveguides GN1, an n-side electrode 105n made of Au—Ge is formed over the tops of the n-type ridge waveguides GN1 and the insulating film ZL1.

Next, as shown in FIG. 3(c), the n-side electrode 105n, the insulating film ZL1, and the semiconductor multilayer film including the active layer AL1 and the p-type layer PL1 are etched to expose the p-side electrode 104p, except the predetermined areas Wdevice including the n-type ridge waveguides GN1 of the first intermediate product 100x (i.e., the areas for forming the first and second semiconductor laser devices 100 and 200, having a width of 100 µm or so). An n-side electrode E3 is also formed on the backside of the n-type substrate 201n of the second intermediate product 200x.

Next, as shown in FIG. 4(a), primary cleaving and secondary cleaving are performed on the intermediate products which have been manufactured in the wafer form as shown in FIGS. 2(a) to 3(c). The intermediate products are thereby divided into each individual chip of multi-wavelength semiconductor laser device LDA. In this process of chip formation, the secondary cleaving is applied to the areas where the foregoing p-side electrode 104p is exposed. This completes each individual multi-wavelength semiconductor laser device LDA as shown in FIG. 4(b), having a pair of n- and p-type ridge waveguides GN1 and GP2 lying in the area Wdevice, and the p-side electrode 104P exposed.

The exposed area of the p-side electrode 104p and the n-side electrode 105n of the first semiconductor laser element 100 are respectively bonded to electrodes E1 and E2 on the submount SUB, both of which are made of Au—Sn.

Incidentally, the two electrodes E1 and E2 on the submount must be electrically insulated from each other so as not to establish electric connection between the n-side electrode 105n of the first semiconductor laser element 100 and the p-side electrode 203p of the second semiconductor laser element 200.

In the example described above, the first semiconductor laser element 100, an AlGaInP red semiconductor laser, is formed with (100) plane as its principal plane and with the n-type ridge waveguide GN1 in <0-11> direction. If this ridge waveguide is formed under an etching condition that is limited by the rate of the surface reaction, the waveguide will be inversely tapered in cross section. The inverse tapered shape is unfavorable since it becomes difficult to form the insulating film and the electrode over the sidewalls of the ridge waveguide. In order to form the n-type ridge waveguide GN1 of the first semiconductor laser element 100 in a forward tapered section, the first intermediate product 100x and the second intermediate product 200x are preferably laminated so that the semiconductor crystal orientation <011> of the first intermediate product 100x and the semiconductor crystal orientation <0-11> of the second intermediate product 200x coincide with each other, and so that the n-type ridge waveguide GN1 of the first semiconductor laser element 100 is in <011> direction. If the first semiconductor laser element 100 uses an off substrate, the principal plane of the off substrate is preferably tilted from (100) plane to (011) plane so as not to tilt the resonator end.

While the adhesive layers MC1 and MC2 in this example are made of Sn and Au, respectively, the materials of the adhesive layers are not limited thereto. Pd, In, and other metal materials may also be used.

This example has dealt with the case where the first semiconductor laser element is a semiconductor laser for emitting red laser light of 650 nm in wavelength, and the second semiconductor laser element is a semiconductor laser for emitting infrared laser light of 780 nm in wavelength. Nevertheless, the first semiconductor laser element may be a semiconductor laser for emitting infrared laser light of 780 nm in wavelength, and the second semiconductor laser element may be a semiconductor laser for emitting red laser light of 650 nm in wavelength.

Figure 9:
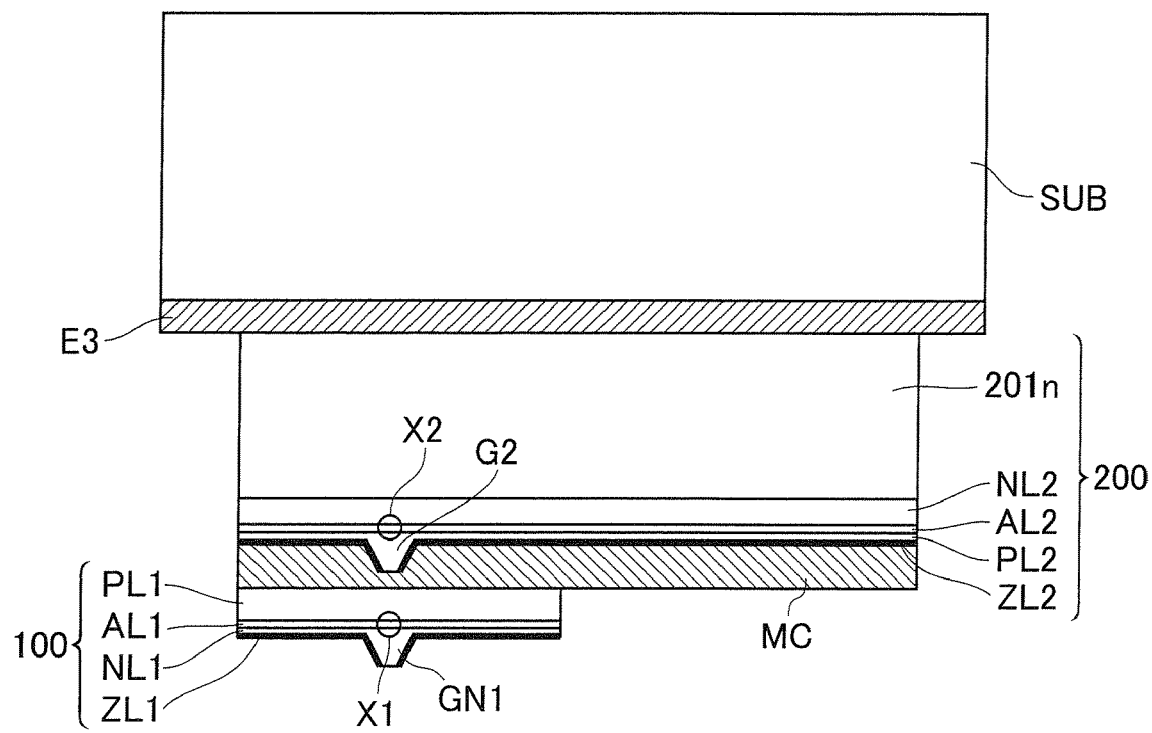
FIG. 9 is a sectional view showing the configuration of a multi-wavelength integrated semiconductor laser device according to a modification of example 1.

Moreover, the first semiconductor laser element may be a semiconductor laser for emitting red laser light of 650 nm in wavelength, and the second semiconductor laser element may be a semiconductor laser for emitting blue laser light of 405 nm in wavelength. In this case, as shown in the sectional view of FIG. 9, the submount SUB is preferably bonded to the backside of the semiconductor substrate 201n of the second semiconductor laser.

Figure 10:
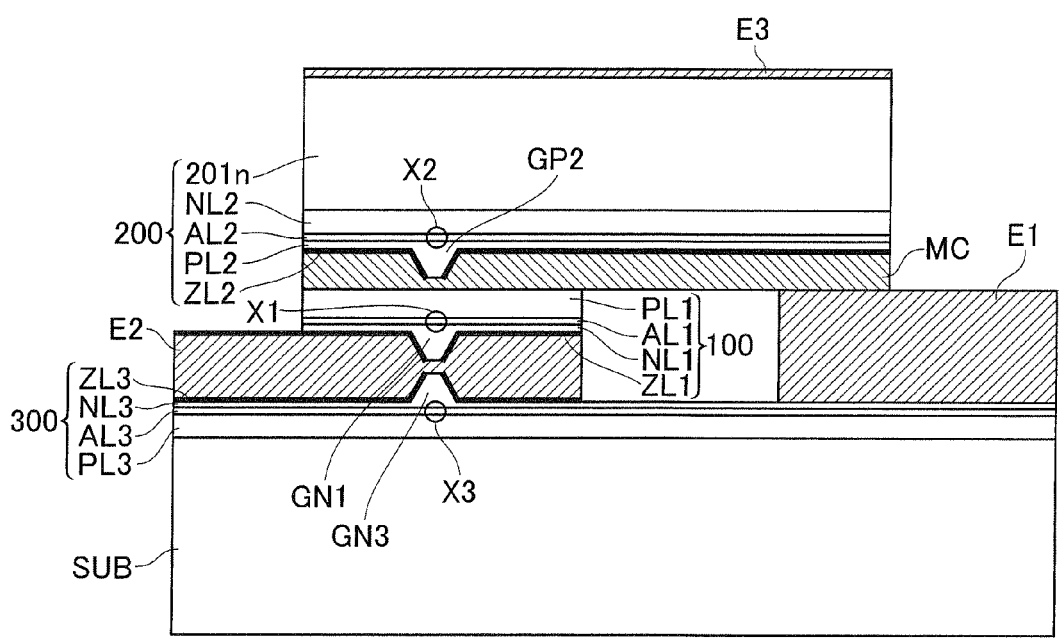
FIG. 10 is a sectional view showing the configuration of a multi-wavelength integrated semiconductor laser device according to another modification.

Furthermore, a third semiconductor laser element 300 for emitting light having a wavelength different from those of the first and second semiconductor laser elements 100 and 200 may be used as the submount SUB. In this case, the multi-wavelength semiconductor laser device shall be configured as shown in the sectional view of FIG. 10.

As has been described, according to the multi-wavelength semiconductor laser device LDA of this example, the ridge waveguide GN1 of the first semiconductor laser element 100 is formed on the side of the n-type semiconductor as shown in FIG. 1. This structure can reduce the contact resistance of the p-side electrode 104p since the entire surface of the p-type layer PL1 is in contact with this p-side electrode over a large contact area.

According to the multi-wavelength integrated semiconductor laser device LDA of this example, the first semiconductor laser element 100 has no substrate. The first semiconductor laser element 100 thus has an extremely small total thickness of 5 µm or thinner, so that both the active layer AL1 of the first semiconductor laser element 100 and the active layer AL2 of the second semiconductor laser element 200 can be located close to the submount SUB. This makes it possible to dissipate heat occurring both in the first semiconductor laser element 100 and the second semiconductor laser element 200 through the submount SUB efficiently.

According to this example, the distance between the light-emitting points X1 and X2 (emission point distance) can be reduced to 10 µm or less. This is advantageous in terms of optical design in such applications as a light source for an optical pickup of a multidisk drive for recording and reproducing DVD and CD, since the two optical axes can be arranged almost coaxially.

According to the manufacturing method of the present embodiment, the first intermediate product 100x and the second intermediate product 200x for fabricating the first semiconductor laser element 100 and the second semiconductor laser element 200 are laminated in a wafer state before they are cleaved into each individual multi-wavelength integrated semiconductor laser device LDA. This can simplify the manufacturing processes and allow uniform formation of multi-wavelength integrated semiconductor laser devices LDA for high mass productivity.

Moreover, according to this manufacturing method, the first intermediate product 100x and the second intermediate product 200x are laminated by the adhesive layer MC before the resonator ends and sidewalls of the respective semiconductor laser elements are formed. This can avoid problems such as an electric short circuit ascribable to intrusion of the adhesive layer into those portions, thereby achieving a multi-wavelength semiconductor laser element LDB of high reliability.

As shown in FIG. 3(b), the n-type ridge stripe GN1 of the first semiconductor laser element 100 is formed to the position of the ridge waveguide GP2 of the second intermediate product 200x after the lamination of the first intermediate product 100x and the second intermediate product 200x. The two ridge waveguides can thus be positioned relative to each other with high accuracy. As a result, each individual multi-wavelength integrated semiconductor laser device LDA can be manufactured with the light-emitting point X1 of the first semiconductor laser element 100 and the light-emitting point X2 of the second semiconductor laser element 200 at a uniform emission point distance with high accuracy.

Incidentally, the positioning accuracy available here is of submicron order.

According to the manufacturing method of this example, the metal antidiffusion layers are formed between the first intermediate product 100x and the adhesive layer MC and between the second intermediate product 200x and the adhesive layer MC. This can effectively prevent the adhesive layer from diffusing into the semiconductor laser multilayer films. More specifically, when laminating the first intermediate product 100x and the second intermediate product 200x, the adhesive layers MC1 and MC2 are integrated by heating at approximately 300° C. under a pressure of around 1 MPa. Since the heating under high pressure can promote diffusion of metal into semiconductors, the adhesive layers will diffuse into the semiconductor laser multilayer films heavily if the foregoing metal antidiffusion layers are absent. In this example, however, the metal antidiffusion layers provide the effect of avoiding the diffusion of the adhesive layers, allowing a significant improvement in yield.

Example 2

Next, a description will be given of a multi-wavelength semiconductor laser device according to another concrete example.

The multi-wavelength semiconductor laser device according to this example basically has the structure shown in FIG. 5, in which a first semiconductor laser element 300 for emitting red laser light of 650 nm in wavelength and a second semiconductor laser element 400 for emitting infrared laser light of 780 nm in wavelength are integrally laminated with a metal adhesive layer MC therebetween. The laser device is basically manufactured through the same manufacturing processes as those of the second embodiment which has been described with reference to FIGS. 6 to 8.

The manufacturing method and the structure of the multi-wavelength semiconductor laser device according to this example will now be described with reference to FIGS. 6 to 8. The description of the manufacturing method and the structure will also use the reference numerals seen in FIGS. 5 to 8.

To fabricate the multi-wavelength semiconductor laser device LDB according to this example, a first intermediate product 300x for fabricating the first semiconductor laser element 300 and a second intermediate product 400x for fabricating the second semiconductor laser element 400 are initially formed by the manufacturing steps shown in FIGS. 6(a) and 6(b).

More specifically, to form the first intermediate product 300x, as shown in FIG. 6(a), a buffer layer (reference numeral omitted) made of n-type GaAs, having a thickness of approximately 0.5 μm is formed on an n-type semiconductor substrate 301n made of n-type GaAs(100). A first etching stop layer 302es of n-type GaInP is then formed to a thickness of approximately 0.05 μm. An n-type contact layer of n-type GaAs, having a thickness of approximately 0.2 μm, and an n-type clad layer of n-type AlGaInP, having a thickness of approximately 1.2 μm, are also deposited in succession to form an n-type layer NL3. Next, a second etching stop layer 303es of n-type GaInP, having a thickness of approximately 0.01 μm, and a multiquantum well structure active layer AL3 of GaInP and AlGaInP, having a thickness of approximately 0.04 μm, are deposited in order. A p-type clad layer of p-type AlGaInP having a thickness of approximately 1.2 μm, an energizing layer of p-type GaInP having a thickness of approximately 0.05 μm, and a p-type contact layer of p-type GaAs having a thickness of approximately 0.2 μm are also deposited in this order to form a p-type layer PL3.

After the semiconductor multilayer film is thus formed on the n-type semiconductor substrate 301n, a p-side ohmic electrode layer of Au—Zn and a metal antidiffusion layer of Ti, Pt, Ir, TIN, or the like are formed on the p-type contact layer of the foregoing p-type layer PL3, thereby forming a p-side electrode 304p. Then, an Sn adhesive layer MC3 is formed thereon to form the first intermediate product 300x.

To form the second intermediate product 400x, as shown in FIG. 6(b), a buffer layer (not shown) made of n-type GaAs, having a thickness of approximately 0.5 μm is formed on an n-type semiconductor substrate 401n made of n-type GaAs (100). A third etching stop layer 402es of n-type GaInP having a thickness of approximately 0.05 μm, an n-type contact layer of n-type GaAs having a thickness of approximately 0.2 μm, and a clad layer of n-type AlGaAs having a thickness of approximately 1.5 μm are then deposited in succession to form an n-type layer NL4. Next, a fourth etching stop layer 403es of n-type GaInP having a thickness of approximately 0.01 μm and a multiquantum well structure active layer AL4 of AlGaAs having a thickness of approximately 0.03 μm are formed in order. A p-type clad layer of p-type AlGaAs having a thickness of approximately 1.2 μm and a p-type contact layer of p-type GaAs having a thickness of approximately 0.2 μm are then deposited in succession to form a p-type layer PL4. Subsequently, a p-side ohmic electrode layer of Au—Zn is deposited on the foregoing p-type contact layer of the p-type layer PL4, and a metal antidiffusion layer of Ti, Pt, Ir, TiN, or the like is formed to make a p-side electrode 404p. An Au adhesive layer MC4 is also formed thereon to form the second intermediate product 400x.

Next, as shown in FIG. 6(c), the adhesive layer MC3 of the first intermediate product 300x and the adhesive layer MC4 of the second intermediate product 400x are put into contact with each other and subjected to a pressure of around 1 MP for pressure welding, followed by heating at approximately 300° C. for five minutes. This integrates the adhesive layers MC1 and MC2 into an adhesive layer MC, thereby laminating the first and second intermediate products 300x and 400x integrally. Here, the adhesive layers MC1 and MC2 are bonded so that the crystal orientation <0-11> of the semiconductor multilayer film of the first intermediate product 300x and the semiconductor crystal orientation <0-11> of the second intermediate product 400x coincide with each other.

Next, as shown in FIG. 7(a), the n-type semiconductor substrate 301n and the buffer layer of the first intermediate product 300x are etched with an etchant that contains ammonia water:hydrogen peroxide water:water in the ratio of 2:1:20, thereby exposing the first etching stop layer 302es. Subsequently, the first etching stop layer 102es exposed is etched with hydrochloric acid to expose the n-type contact layer of the n-type layer NL3. Here, in order not to etch the n-type semiconductor substrate 401n of the second intermediate product 400x, the second intermediate product 400x is covered with wax or the like at the side of the n-type semiconductor substrate 401n.

Next, as shown in FIG. 7(b), the n-type layer NL3 (i.e., the n-type contact layer and the n-type clad layer) of the first intermediate product 300x is partly etched down to the second etching stop layer 303es, thereby forming n-type ridge waveguides GN3 in <0-11> direction. Here, the n-type ridge waveguides GN3 are formed at a predetermined pitch interval WTP and in a predetermined width W3.

After an insulating film ZL3 of $SiO_2$ is formed over the n-type layer NL3 except the tops of these n-type ridge waveguides GN3, an n-side electrode 305n made of Au—Ge is formed over the tops of the n-type ridge waveguides GN3 and the insulating film ZL3.

Next, as shown in FIG. 7(c), the n-side electrode 305n of the first intermediate product 300x is bonded to a conductive submount SUB via an Au—Sn electrode E4. The submount SUB is desirably made of a cleavable material, such as Si and SiC. Then, the cleavage plane of the submount SUB is desirably positioned to coincide with the cleavage planes (011) of the semiconductor laser multilayer film of the first intermediate product 300x and the semiconductor laser multilayer film of the second intermediate product 400x.

If the submount SUB is made of an uncleavable material, however, isolating trenches intended for primary cleaving and secondary cleaving to be described later are formed in the submount SUB in advance. The first and second semiconductor laser elements 300 and 400 made of the semiconductor laser multilayer films are bonded so that the isolating trenches for primary cleaving and their cleavage planes coincide with each other.

Next, as shown in FIG. 8(a), the n-type semiconductor substrate 401n and the buffer layer of the second intermediate product 400x are etched with an etchant that contains ammonia water:hydrogen peroxide water:water in the ratio of 2:1:20, thereby exposing the third etching stop layer 402es. Subsequently, the first etching stop layer 402es exposed is etched with hydrochloric acid to expose the n-type contact layer of the n-type layer NL4.

Next, as shown in FIG. 8(b), the n-type layer NL4 (i.e., the n-type contact layer and the n-type clad layer) exposed is partly etched to form n-type ridge waveguides GN4 in <0-11> direction. Here, the n-type ridge waveguides GN4 are formed to the positions of the n-type ridge waveguides GN3 which are formed in advance.

After an insulating film ZL4 of $SiO_2$ is formed over the n-type layer NL4 except the tops of the n-type ridge waveguides GN4, an n-side electrode 305n made of Au—Ge is formed over the entire surface including the tops of the n-type ridge waveguides GN4 and the insulating film ZL4.

Next, as shown in FIG. 8(c), the n-side electrode 405n, the insulating film ZL4, and the semiconductor laser multilayer film including the active layer AL4 and the p-type layer PL4 are etched to expose the p-side electrode 404p, except the predetermined areas Wdevice including the n-type ridge waveguides GN4 of the second intermediate product 400x (i.e., the areas for forming the first and second semiconductor laser devices 300 and 400, having a width of 100 μm or so).

Next, as shown in the perspective view of FIG. 8(d), primary cleaving and secondary cleaving are performed on the intermediate products which have been manufactured in the wafer form as shown in FIGS. 6(a) to 8(c). The intermediate products are thereby divided into each individual chip of multi-wavelength semiconductor laser device LDB. In this process of chip formation, the secondary cleaving is applied to the areas where the foregoing adhesive layer MC is exposed. This completes each individual multi-wavelength semiconductor laser devices LDB, having a pair of n-type ridge waveguides GN3 and GN4 lying in the area Wdevice, and the p-side electrode 404p exposed.

If the submount SUB is made of an uncleavable material, primary cleaving and secondary cleaving are performed along the isolating trenches formed in advance, thereby completing each individual multi-wavelength semiconductor laser device LDB.

While the adhesive layers MC1 and MC2 in this example are made of Sn and Au, respectively, the materials of the adhesive layers are not limited thereto. Pd, In, and other metal materials may also be used.

This example has dealt with the case where the first semiconductor laser element is a semiconductor laser for emitting red laser light of 650 nm in wavelength, and the second semiconductor laser element is a semiconductor laser for emitting infrared laser light of 780 nm in wavelength. Nevertheless, the first semiconductor laser element may be a semiconductor laser for emitting infrared laser light of 780 nm in wavelength, and the second semiconductor laser element may be a semiconductor laser for emitting red laser light of 650 nm in wavelength.

The multi-wavelength semiconductor laser device LDB according to this example can also provide the same effects as those of the foregoing example 1. In addition, according to the multi-wavelength semiconductor laser device LDB of this example, the ridge waveguide GN4 of the second semiconductor laser element 400 is also formed on the side of the n-type semiconductor as shown in FIG. 5. This structure can reduce the contact resistance of the p-side electrode 404p since the entire surface of the p-type layer PL4 is in contact with this p-side electrode over a large contact area.

The manufacturing method according to this example can also provide the same effects as those of the foregoing example 1. Moreover, according to the manufacturing method of this example, the first intermediate product 300x and the second intermediate product 400x are laminated at their respective flat surfaces having no ridge waveguide as shown in FIG. 6(c). The metal adhesive layers MC3 and MC4 can thus be bonded by solid-phase diffusion or other processes using such adhesive layers as gold (Au) and aluminum (Al), not by heat fusion, so that a heat treatment of relatively high temperature can be performed after the bonding. That is, the bonding can be followed by such heat treatments as electrode alloying and electrode annealing, making it possible to form a multi-wavelength semiconductor laser with excellent electric characteristics.

The invention claimed is:

1. A method for manufacturing a multi-wavelength integrated semiconductor laser device for emitting laser beams of different wavelengths, the method, in the following order, comprising:
   a first step of forming a first semiconductor laser multilayer film on a first substrate, the first semiconductor laser multilayer film including an etching stop layer;
   a second step of forming a second semiconductor laser multilayer film on a second substrate;
   a third step of forming a ridge waveguide in said second semiconductor laser multilayer film;
   a fourth step of bonding said first semiconductor laser multilayer film and said second semiconductor laser multilayer film to each other via an adhesive layer made of metal;
   a fifth step of etching said first substrate to expose said etching stop layer;
   a sixth step of etching said etching stop layer;
   a seventh step of forming a ridge waveguide in said first semiconductor laser multilayer film; and
   an eighth step of etching said first semiconductor laser multilayer film, except a predetermined area including said ridge waveguide of said first semiconductor laser multilayer film.

2. The method for manufacturing a multi-wavelength integrated semiconductor laser device according to claim 1, wherein:
   said first and second substrates are made of an n-type semiconductor;
   said ridge waveguide of said first semiconductor laser multilayer film is made of an n-type semiconductor; and
   said ridge waveguide of said second semiconductor laser multilayer film is made of a p-type semiconductor.

3. The method for manufacturing a multi-wavelength integrated semiconductor laser device according to claim 1, wherein the first step further includes a step of depositing a metal antidiffusion layer made of Ti, Pt, Ir, or TiN after the formation of said first semiconductor laser multilayer film.

4. The method for manufacturing a multi-wavelength integrated semiconductor laser device according to claim 1, wherein the third step further includes a step of depositing a metal antidiffusion layer made of Ti, Pt, Ir, or TiN after the formation of said ridge waveguide.

5. The method for manufacturing a multi-wavelength integrated semiconductor laser device according to claim 1, comprising a ninth step, after the eighth step, of bonding a submount to said first semiconductor laser multilayer film via metal at a side where said ridge waveguide is formed.

6. The method for manufacturing a multi-wavelength integrated semiconductor laser device according to claim 1, comprising a ninth step, after the eight step, of bonding a third semiconductor laser for emitting a laser beam having a third wavelength to said first semiconductor laser multilayer film via metal at a side where said ridge waveguide is formed.

7. The method for manufacturing a multi-wavelength integrated semiconductor laser device according to claim 6, wherein said third semiconductor laser has an active layer comprising III-V compound semiconductor, and said V compound contains at least nitrogen (N).

8. A method for manufacturing a multi-wavelength integrated semiconductor laser device for emitting laser beams of different wavelengths, the method, in the following order, comprising:
   a first step of forming a first semiconductor laser multilayer film on a first substrate, the first semiconductor laser multilayer film including a first etching stop layer;

a second step of forming a second semiconductor laser multilayer film on a second substrate, the second semiconductor laser multilayer film including a second etching stop layer;

a third step of bonding said first semiconductor laser multilayer film and said second semiconductor laser multilayer film to each other via an adhesive layer made of metal;

a fourth step of etching said first substrate to expose said first etching stop layer;

a fifth step of etching said first etching stop layer;

a sixth step of forming a ridge waveguide in said first semiconductor laser multilayer film;

a seventh step of bonding a submount to said first semiconductor laser multilayer film via metal at a side where said ridge waveguide is formed;

an eighth step of etching said second substrate to expose said second etching stop layer;

a ninth step of etching said second etching stop layer;

a tenth step of forming a ridge waveguide in said second semiconductor laser multilayer film; and an eleventh step of etching said second semiconductor laser multilayer film, except a predetermined area including said ridge waveguide of said second semiconductor laser multilayer film.

9. The method for manufacturing a multi-wavelength integrated semiconductor laser device according to claim 8, wherein:

said first and second substrates are made of an n-type semiconductor; and said ridge waveguides of said first and second semiconductor laser multilayer films are made of an n-type semiconductor.

10. The method for manufacturing a multi-wavelength integrated semiconductor laser device according to claim 8 or 9, wherein:

said submount is made of a cleavable material; and in the seventh step, a cleavage plane of said submount and cleavage planes of said first and second semiconductor laser multilayer films are aligned to each other.

11. The method for manufacturing a multi-wavelength integrated semiconductor laser device according to claim 8 or 9, wherein:

said submount has a trench for isolation; and in the seventh step, said trench and said first and second cleavage planes of said semiconductor laser multilayer film are aligned in direction.

12. The method for manufacturing a multi-wavelength integrated semiconductor laser device according to claim 8, wherein the first step further includes depositing a metal antidiffusion layer made of Ti, Pt, Ir, or TiN after the formation of said first semiconductor laser multilayer film.

13. The method for manufacturing a multi-wavelength integrated semiconductor laser device according to claim 8, wherein the second step further includes depositing a metal antidiffusion layer made of Ti, Pt, Ir, or TiN after the formation of said second semiconductor laser multilayer film.

14. The method for manufacturing a multi-wavelength integrated semiconductor laser device according to any one of claim 1 or 8, wherein:

said first semiconductor laser multilayer film has an active layer containing at least phosphorus (P); and said second semiconductor laser multilayer film has an active layer containing at least arsenic (As).

15. The method for manufacturing a multi-wavelength integrated semiconductor laser device according to any one of claim 1 or 8, wherein:

said first semiconductor laser multilayer film has an active layer containing at least arsenic (As); and said second semiconductor laser multilayer film has an active layer containing at least phosphorus (P).

16. The method for manufacturing a multi-wavelength integrated semiconductor laser device according to any one of claims 1 to 4, wherein:

said first semiconductor laser multilayer film has an active layer containing at least phosphorus (P); and said second semiconductor laser multilayer film has an active layer comprising III-V compound semiconductor, and said V compound contains at least nitrogen (N).

* * * * *